Figure 1:
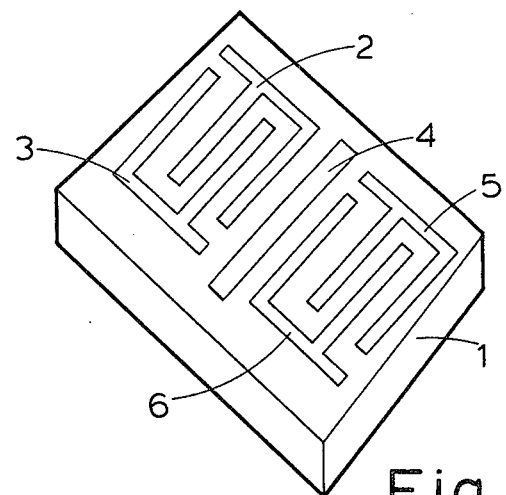

United States Patent [19]

Brice et al.

[11] Patent Number: 4,472,652
[45] Date of Patent: Sep. 18, 1984

[54] ELECTRODE PIEZOELECTRIC DEVICES INCLUDING SURFACE WAVE DEVICES

[75] Inventors: John C. Brice; James E. Curran, both of Sussex, England

[73] Assignee: U.S. Philips Corporation, New York, N.Y.

[21] Appl. No.: 34,525

[22] Filed: Apr. 30, 1979

[30] Foreign Application Priority Data

May 9, 1978 [GB] United Kingdom ............... 18461/78

[51] Int. Cl.³ ............................................. H01L 41/08
[52] U.S. Cl. .................................. 310/313 B; 310/320; 310/363; 310/364; 310/344; 29/25.35
[58] Field of Search ............... 310/312, 320, 363, 364, 310/313 B, 313 C, 344; 29/25.35

[56] References Cited

U.S. PATENT DOCUMENTS 3,363,119 1/1968 Koneval et al. ................... 310/320
4,130,771 12/1978 Bottom ................................ 310/312

OTHER PUBLICATIONS

Metals Handbook, Vol. 2, 8th Edition, p. 620 (1964).
Kirk-Othmer, Encyclopedia of Chemical Technology, Vol. 2, 3rd Ed., pp. 219 and 225 (1978).
Kirk-Othmer, Encyclopedia of Chemical Technology, 2nd Ed., pp. 48 and 49 (1963), Vol. 2.

*Primary Examiner*—Mark O. Budd
*Attorney, Agent, or Firm*—Robert T. Mayer; Bernard Franzblau

[57] ABSTRACT

A piezoelectric device comprising a housing that contains a piezoelectric body bearing aluminum film electrodes. The exposed surfaces of the electrodes bear a passivating layer of amorphous aluminum oxide formed by heating the electrodes at a temperature between 250° and 550° C. in an atmosphere containing free oxygen.

6 Claims, 5 Drawing Figures

ELECTRODE PIEZOELECTRIC DEVICES INCLUDING SURFACE WAVE DEVICES

The invention relates to a piezoelectric device comprising a body of piezoelectric material bearing aluminum film electrodes and contained in a protective housing. Such devices are used, for example as resonstors for frequency control and in frequency filters.

A serious consideration with piezoelectric devices which have aluminum electrodes and are used as resonators or in frequency filters is that the resonant frequency of the devices changes slowly with time. Aluminum is a very reactive material, and it oxidizes slowly in the environments present in most practical encapsulations. The thickness of the aluminum oxide layer formed on aluminum after oxidation in air at room temperature is several tens of Ångstroms thick. It is usually assumed that the thickness d of this layer (expressed in Ångstroms) is given by an equation of the form $d = 50 (1 - \exp(t/\tau))$, where t is the time which has elapsed and $\tau$ is a characteristic time which is about 1 month at room temperature. The resulting increase in the thickness of the oxide film causes a slow change in the resonant frequency of the device. United Kingdom Specification No. 1,185,819 describes a method of mass-loading a piezoelectric device in order to adjust the resonant frequency thereof by anodising an aluminum electrode so as to convert at least part of its outside surface to aluminum oxide, thus mass-loading the device by the added mass of oxygen chemically combined by the anodising process.

An object of the invention is to improve the stability of the resonant frequency of piezoelectric devices.

The invention provides a piezoelectric device comprising a body of piezoelectric material bearing aluminum film electrodes contained in a protective housing, in which device the surfaces of the electrodes not in contact with the piezoelectric body bear a layer of amorphous aluminum oxide at least 100 Å thick, and the aluminum metal under the amorphous aluminum oxide layer is more than 400 Å thick. It was found that the presence of the amorphous aluminum oxide signficantly reduced the rate of change of the resonant frequency of the device compared with the rate of change of the resonant frequency of a similar device in which no similar amorphous aluminum oxide layer had been formed on the exposed surfaces of the aluminum. Generally the amorphous aluminum oxide layers are 100 to 500 Å thick.

The piezoelectric material may be, for example, a natural crystal such as quartz, a synthetic crystal such as lithium niobate or bismuth silicon oxide, or may be a piezoelectric ceramic such as lead zirconate titanate.

A piezoelectric device according to the invention may be manufactured by a method comprising the steps of forming aluminum film electrodes on a body of piezoelectric material, heating the body bearing the aluminum electrodes at a temperature between 250° and 550° C. in an atmosphere containing free oxygen so as to form an amorphous aluminum oxide layer at least 100 Å thick on the surfaces of the electrodes not in contact with the body, and sealing the piezoelectric body bearing the electrodes in a protective housing, the initial thickness of the aluminum film electrodes being sufficient to leave a thickness of more than 400 Å of aluminum metal under the amorphous aluminum oxide layers. The film electrodes are usually made by evaporation or sputtering of aluminum which is at least 99.99% pure. This figure, of course, excludes deliberately added dopants such as silicon or germanium. The magnesium content of the aluminum electrodes must be less than 0.1% by weight so as to avoid producing a crystalline layer of aluminum oxide during the oxidation of the exposed surfaces of the aluminum electrodes. The amorphous aluminum oxide layer may be formed by heating the piezoelectric body bearing the aluminum electrodes between 350° and 450° C. for from 10 to 5 minutes in an atmosphere containing free oxygen. This novel method is effectively a dry process, where dry means the body is heated in a non-liquid environment.

When it is necessary to reduce the time taken to form the amorphous aluminum oxide layer, the piezoelectric body bearing the aluminum electrodes may be heated at a temperature between 400° and 550° C., using aluminum containing from 0.07 to 0.15% by weight of Si or Ge which serves as an aluminum oxide-crystallisation inhibitor since, in the absence of such an inhibitor, the aluminum oxide formed by heating aluminum oxide in this temperature range may be crystalline.

The amorphous aluminum oxide layer serves as a barrier which signficantly retards the rate of oxidation of the aluminum in the encapsulated device. During the investigations which led to the invention, it was found that the amorphous aluminum oxide layers made by thermal oxidation were much less permeable than similar thickness aluminum oxide layers produced by anodic oxidation of aluminum. In order to maintain the oxide layers produced by thermal oxidation in an amorphous state, the oxidation must be conducted at temperatures below 550° C. It was found that crystalline aluminum oxide layers are considerably more permeable than amorphous aluminum oxide layers. It is therefore necessary to avoid using aluminum containing 0.1% by weight or more of magnesium which promotes crystallisation of aluminum oxide when aluminum oxide containing such a quantity of magnesium is heated above 350° C.

In some piezoelectric devices, for example, acoustic surface wave devices, passivating the aluminum electrodes by forming a layer of amorphous aluminum oxide on the exposed surfaces of the electrodes provides the advantage of reducing ageing of the devices in the sense of reducing the change of the resonant frequency of the device with time.

It was found with acoustic surface wave devices which were piezoelectric devices according to the invention and which used quartz crystals as the piezoelectric bodies, that the rate of ageing was reduced by a factor of 4 compared with similar devices in which the aluminum electrodes bore no similar aluminum oxide layers. Similar results have been obtained with acoustic surface wave devices in which the piezoelectric material was lithium niobate or bismuth silicon oxide.

In other piezoelectric devices, the amorphous aluminum oxide serves to retard electrolytic destruction of the electrodes very significantly. Frequency changes in TV filters made using lithium niobate or bismuth silicon oxide are not a significant effect, but if these devices are made with aluminum electrodes which have not been passivated and are sealed in a casing containing water, the operating life of these devices is less than 300 hours. It was found with similar TV filters having aluminum electrodes whose surfaces not in contact with the piezoelectric body bear a layer of amorphous aluminum oxide which is at least 100 Å thick, that the water content of the environment inside the device casing was of negligible importance, and that the operating life of these devices was more than 10,000 hours.

Figure 2:
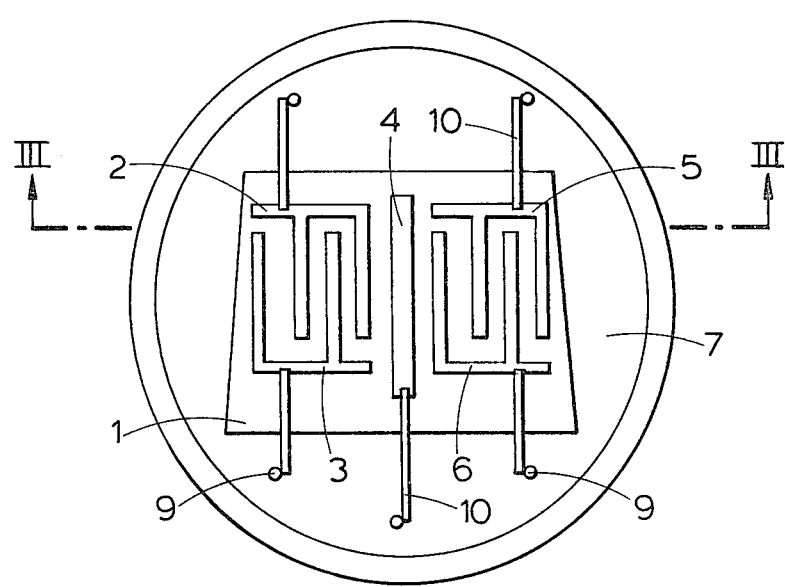
Figure 3:
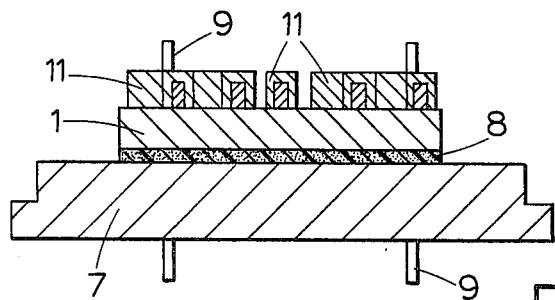
Figure 4:
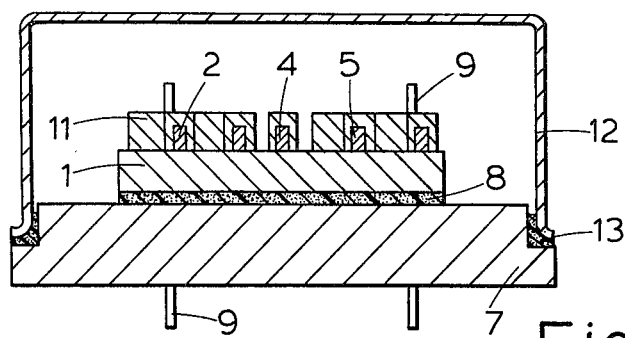
Figure 5:
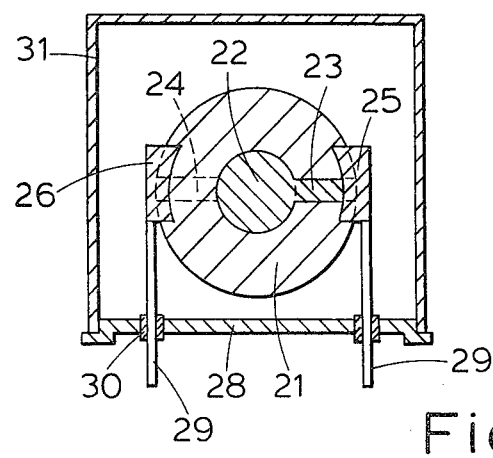

Some embodiments of the invention will now be described with reference to the following Examples and to the drawing, in which:

FIG. 1 is a schematic partly perspective view of a quartz crystal bearing an aluminum film electrode structure, FIG. 2 is a plan view of an assembly consisting of the FIG. 1 assembly bonded to a glass header, FIG. 3 is a sectional elevation of the FIG. 2 assembly taken on the line III—III and viewed in the direction of the arrows, FIG. 4 is a sectional elevation of a piezoelectric device made by bonding a protective housing to the assembly shown in FIG. 3, the section being viewed from the same position as the sectional elevation shown in FIG. 3, and FIG. 5 is a side-sectional elevation of a bulk wave quartz resonator according to the invention.

EXAMPLE 1

An 800 Å thick film of aluminum was evaporated onto a 1 mm thick AT cut quartz plate 1 using 99.99% pure aluminum wire containing 0.002% by weight of magnesium as the source material. An electrode pattern of a surface wave device was formed on the quartz plate 1 by subjecting the aluminum film to normal photolithographic processes. This electrode pattern consisted of input interdigital electrodes 2 and 3, a screening stripe 4 and output interdigital electrodes 5 and 6 (FIG. 1).

The quartz plate 1 was then bonded to a nickel-plated fernico header 7 by means of a silver-loaded epoxy resin 8 (Epo-Tek type H31), the electrode pattern being left exposed (FIG. 2). The electrodes and screening stripe were electrically connected to metal pins 9 of the header 7 by means of aluminum wires 10, the connections being made by ultrasonic bonding. The metal pins 9 are insulated from the header 7 by means of glass sleeves which are not shown.

The assembly shown in FIG. 2 was then heated in air at 400° C. for 10 minutes. This heat treatment produced a 250 μm thick amorphous layer 11 of aluminum oxide on the aluminum surfaces not in contact with the quartz plate 1 (FIG. 3). For the sake of clarity, the aluminum wires 10 are not shown in FIG. 3. The assembly was cooled and an aluminum can 12 was sealed in a dry nitrogen atmosphere to the metal header 7 by means of a layer 13 of a silver-loaded epoxy resin (Epo-Tek type H31) (FIG. 4).

It was found that in acoustic surface wave devices of the type shown in the drawing, which had resonant frequencies of 170 MHz and were operated at 50° C., the resonant frequency changed by 3 parts per million in the first 2 weeks after manufacture, and by a further 2 parts per million during the next 10 weeks. Similar devices in which the exposed aluminum had not been provided with an amorphous aluminum oxide layer by thermal oxidation had changes of their resonant frequency of 12 parts per million during the first 2 weeks and 8 parts per million in the next 10 weeks.

EXAMPLE 2

A device similar to that described in Example 1 with reference to FIGS. 1 to 4 of the drawing was prepared by a similar method, except that the aluminum film electrodes 2, 3 and screening stripe 4 were prepared by evaporation of an aluminum-silicon alloy containing 0.5% by weight of silicon. The silicon content of the film electrodes 2,3 and screening stripe 4 was 0.1% by weight. The amorphous aluminum oxide layers were produced by heating the assembly shown in FIG. 1 at 450° C. in air for 2 minutes. The thickness of these amorphous aluminum oxide layers was about 200 Å. The quartz plate 1 was then bonded to a nickel-plated fernico header 7, and the electrodes 2,3 and screening stripe 4 were electrically connected to metal pins 9 of the header 7 by means of aluminum wires 10, the connections being made by ultrasonic bonding. The ageing characteristics of this device were similar to those of the Example 1 device according to the invention.

The aluminum film electrodes may be made by evaporating an aluminum-germanium alloy containing 1% by weight of germanium. The deposited electrodes thus obtained contain 0.1% by weight of germanium. The ageing characteristics of a device made using such electrodes were found to be similar to the ageing characteristics of the Example 1 device according to the invention.

EXAMPLE 3

A bulk wave quartz resonator was made using an AT cut disc 21 12 mm in diameter. The disc was coarse lapped and was then lapped using fine alumina powder (0.05 μm diameter particle size). The lapped disc was etched for 2 minutes in a saturated solution of ammonium bifluoride at room temperature. The thickness of the disc 21 after this processing was 0.166 mm. 5 mm diameter aluminum electrodes 22 (about 1000 Å thick) having contact stripes 23,24 extending respectively to opposite portions of the periphery of the disc 21 were evaporated onto the disc 21 using 99.99% pure aluminum which contained 0.002% by weight of magnesium. The disc 21 was then cemented into nickel-plated fernico clips 25,26 of a header by means of a silver-loaded epoxy resin (Epo-Tek H31). The header comprised a nickel-plated fernico base portion 28 with nickel-plated fernico pins 29 insulated from the base portion 28 by means of glass sleeves 30. The assembly was then heated in air at 400° C. for 5 minutes in order to form an amorphous layer of aluminum oxide which was about 250 Å thick on the aluminum electrodes 22 and contact stripes 23,24 so as to passivate the aluminum surfaces. The assembly was then sealed using a conventional cold weld process into a nickel-plated fernico can 31 filled with dry nitrogen. It was found that with devices made by this process which had resonant frequencies of about 10 MHz, the frequencies changed by less than 1 part per million per year. However, if the exposed aluminum surfaces had not been passivated, the rate of change of the resonant frequency of the devices was about 5 parts per million per year.

We claim:

1. An acoustic surface wave device comprising a plate of piezoelectric material having one surface bearing first and second aluminum film interdigital electrodes containing 0.07 to 0.15% by weight of silicon or germanium and contained in a protective housing wherein the surfaces of the electrodes not in contact with the piezoelectric body bear a layer of amorphous aluminum oxide at least 100 Å thick formed by a process of heating the body bearing the aluminum electrodes at a temperature between 400° and 550° C. in an atmosphere containing free oxygen, and wherein the aluminum metal under the amorphous aluminum oxide layer is at least 400 Å thick.

2. A piezoelectric device comprising a body of piezoelectric material contained in a protective housing and having a surface bearing aluminum film electrodes having a magnesium content of less than 0.1% by weight wherein the surfaces of the electrodes not in contact with the piezoelectric body bear a layer of amorphous aluminum oxide at least 100 Å thick formed by a thermal oxidation process of heating the body bearing the aluminum electrodes at a temperature between 250° and 550° C. in a dry atmosphere containing free oxygen, and wherein the aluminum metal under the amorphous aluminum oxide layer is at least 400 Å thick.

3. A method of manufacturing a piezoelectric device comprising the steps of forming aluminum film electrodes on a piezoelectric body with the aluminum containing from 0.07 to 0.15% by weight of Si or Ge which serve as an aluminum oxide crystallisation inhibitor, heating the body bearing the aluminum electrodes at a temperature between 400° and 550° C. in an atmosphere containing free oxygen so as to form an amorphous aluminum oxide layer at least 100 Å thick on the surfaces of the electrodes not in contact with the piezoelectric body, and sealing the piezoelectric body bearing the electrodes in a protective housing, the initial thickness of the aluminum film electrodes being sufficient to leave a thickness of more than 400 Å of aluminum metal under the amorphous aluminum oxide layer.

4. A method of manufacturing a piezoelectric device comprising the steps of forming aluminum film electrodes on a piezoelectric body wherein the aluminum of the electrodes contains less than 0.1% by weight by magnesium, heating the body bearing the aluminum electrodes at a temperature between 250° and 550° C. in an atmosphere containing free oxygen so as to form an amorphous aluminum oxide layer at least 100 Å thick on the surfaces of the electrodes not in contact with the piezoelectric body, and sealing the piezoelectric body bearing the electrodes in a protective housing, the initial thickness of the aluminum film electrodes being sufficient to leave a thickness of more than 400 Å of aluminum metal under the amorphous aluminum oxide layer.

5. A method of manufacturing a piezoelectric device comprising the steps of forming aluminum film electrodes on a piezoelectric body by evaporating an aluminum-silicon alloy containing 0.5% by weight of silicon on the piezoelectric body, heating the body bearing the aluminum electrodes at a temperature of 450° C. for two minutes in an atmosphere containing free oxygen so as to form an amorphous aluminum oxide layer at least 100 Å thick on the surfaces of the electrodes not in contact with the piezoelectric body, and sealing the piezoelectric body bearing the electrodes in a protective housing, the initial thickness of the aluminum film electrodes being sufficient to leave a thickness of more than 400 Å of aluminum metal under the amorphous aluminum oxide layer.

6. A method of manufacturing a piezoelectric device comprising the steps of forming aluminum film electrodes on a piezoelectric body, heating the body bearing the aluminum electrodes at a temperature between 350° and 450° C. for a period from 10 to 5 minutes in an atmosphere containing free oxygen so as to form an amorphous aluminum oxide layer at least 100 Å thick on the surfaces of the electrodes not in contact with the piezoelectric body, and sealing the piezoelectric body bearing the electrodes in a protective housing, the initial thickness of the aluminum film electrodes being sufficient to leave a thickness of more than 400 Å of aluminum metal under the amorphous aluminum oxide layer.

* * * * *